United States Patent
Kwon

(10) Patent No.: US 9,040,820 B2
(45) Date of Patent: May 26, 2015

(54) SOLAR POWER INVERTER WITH SEALING MEANS

(71) Applicant: LSIS CO., LTD., Anyang-si, Gyeonggi-do (KR)

(72) Inventor: Hyuk Il Kwon, Suwon-si (KR)

(73) Assignee: LSIS Co., Ltd., Anyang-Si, Gyeonggi-Do (KR)

(*) Notice: Subject to any disclaimer, the term of this patent is extended or adjusted under 35 U.S.C. 154(b) by 145 days.

(21) Appl. No.: 13/794,161

(22) Filed: Mar. 11, 2013

(65) Prior Publication Data

US 2013/0240233 A1  Sep. 19, 2013

(30) Foreign Application Priority Data

Mar. 19, 2012  (KR) .................... 20-2012-0002178 U

(51) Int. Cl.
```
H01J 5/00      (2006.01)
H05K 5/00      (2006.01)
H02G 3/08      (2006.01)
H02G 3/14      (2006.01)
H05K 7/14      (2006.01)
H01J 15/00     (2006.01)
H05K 5/06      (2006.01)
H01R 13/502    (2006.01)
A47B 96/04     (2006.01)
```

(52) U.S. Cl.
CPC ............. H05K 5/0021 (2013.01); H02G 3/08 (2013.01); H02G 3/14 (2013.01); H02G 3/081 (2013.01); H02G 3/088 (2013.01); H05K 7/1432 (2013.01)

(58) Field of Classification Search
CPC ......... H02G 3/08; H02G 3/081; H02G 3/088; H02G 3/14
USPC .............. 174/50, 50.5, 50.51, 559, 560, 561, 174/562; 312/400
See application file for complete search history.

(56) References Cited

U.S. PATENT DOCUMENTS 5,747,734 A * 5/1998 Kozlowski et al. ............. 174/50

FOREIGN PATENT DOCUMENTS

| CN | 2310046 | 3/1999 |
| CN | 201063631 | 5/2008 |
| CN | 201700109 | 1/2011 |
| CN | 102271476 | 12/2011 |

OTHER PUBLICATIONS

The State Intellectual Property Office of the People's Republic of China Application Serial No. 201310088488.3, Office Action dated Dec. 1, 2014, 6 pages.

* cited by examiner

*Primary Examiner* — Hoa C Nguyen
*Assistant Examiner* — Binh Tran
(74) *Attorney, Agent, or Firm* — Lee, Hong, Degerman, Kang & Waimey

(57) ABSTRACT

A solar power inverter having a sealing means includes: a main case having an opening on a front surface thereof, the opening open and closed by a main cover; an auxiliary case coupled to one side surface of the main case, and having a second opening on a front surface thereof, the second opening open and closed by an auxiliary cover; and a gasket interposed between the main case and the auxiliary case, wherein the main case and the auxiliary case are coupled to each other by coupling bolts which pass through the main case, the gasket and the auxiliary case.

3 Claims, 5 Drawing Sheets

SOLAR POWER INVERTER WITH SEALING MEANS

CROSS-REFERENCE TO RELATED APPLICATION

Pursuant to 35 U.S.C. §119(a), this application claims the benefit of earlier filing date and right of priority to Korean Utility Model Application No. 20-2012-0002178, filed on Mar. 19, 2012, the contents of which is incorporated by reference herein in its entirety.

BACKGROUND OF THE INVENTION

1. Field of the Invention

The present disclosure relates to a solar power inverter with a sealing means, and particularly, to a solar power inverter used in a solar power generating system and having a sealing means.

2. Background of the Invention

A solar power generating system serves to generate power using a solar power panel or a solar power panel array. Here, a current generated from the solar power panel or the solar power panel array is a direct current (DC). The DC needs to be converted into a general alternating current (AC), so as to be supplied to homes, companies, etc.

A solar power inverter is used to convert the DC generated from the solar power panel or the solar power panel array, into an AC. Generally, the solar power inverter includes a main case having inverter circuitry mounted therein, and an auxiliary case where various types of wires, etc. are accommodated. The auxiliary case is coupled to the main case.

Generally, the solar power generating system is used in an exposed state to the outdoor such as the desert or the plain. Therefore, the solar power generating system should be sealed so as not to be influenced by meteorological environments such as rain, wind or snow. Especially, in a case where snow or rain permeates contact parts of the main case and the auxiliary case, the main case and the auxiliary case may corrode, or may have their inner insulated states destroyed. In order to solve such problems, various types of sealing means have been used.

FIG. 1 is a sectional view schematically showing a sealing means for a solar power inverter in accordance with the conventional art.

Referring to FIG. 1, the solar power inverter includes a main case 10, and an auxiliary case 20 disposed below the main case 10. Sealing means 30 are coupled along flanges 22 protruding from the surface of the auxiliary case 20. The sealing means 30 has a sealing portion 32 disposed on the bottom surface of the main case 10, and a fixing portion 34 fixed to the flange 22 by contacting a plurality of protrusions formed on the surface of the flange 22.

The main case 10 and the auxiliary case 20 are coupled to each other by an additional coupling means. Under such configuration, dust or moisture is prevented from being introduced into the solar power inverter as the sealing portion 32 is pressure-welded to the surface of the main case 10.

However, the conventional sealing means has the following problems.

Firstly, the sealing means should be cut to correspond to the length of the flange of the auxiliary case, and then should be bonded to the main case 10. In this case, the bonding process is not easy, and water leakage may occur due to a weak bonded part if the sealing means is used for a long time. Further, if the flange has a quadrangular shape, the sealing means is not smoothly transformed at the corners. This may cause part of the sealing means not to contact the main case, resulting in lowering of a sealing performance.

SUMMARY OF THE INVENTION

Therefore, an aspect of the detailed description is to provide a solar power inverter capable of being easily installed, and capable of having a sealing means for effectively sealing a gap between a main case and an auxiliary case.

To achieve these and other advantages and in accordance with the purpose of this specification, as embodied and broadly described herein, there is provided a solar power inverter having a sealing means, comprising: a main case having an opening on a front surface thereof, the opening open and closed by a main cover; an auxiliary case coupled to one side surface of the main case, and having a second opening on a front surface thereof, the second opening open and closed by an auxiliary cover; and a gasket interposed between the main case and the auxiliary case, wherein the main case and the auxiliary case are coupled to each other by coupling bolts which pass through the main case, the gasket and the auxiliary case.

In the present invention, side surfaces of the main case and the auxiliary case where no openings are formed, may be disposed to face each other. Then, the two cases may be coupled to each other by bolts in a state where the gasket is interposed therebetween. This can allow the main case and the auxiliary case to be stably coupled to each other, and can effectively prevent dust or moisture from being introduced into the solar power inverter while the gasket is compressed by a bolt coupling force. The openings may serve as entrances through which items to be accommodated in the main case and the auxiliary case are introduced. However, in some cases, the openings may also serve as spaces to which a user's hand and tools are introduced.

The gasket may be formed of a silicon material, and may be configured to contact edges of the side surfaces of the main case and the auxiliary case, the side surfaces facing each other.

One of the main cover and the auxiliary cover may extend to the contact surfaces of the main case and the auxiliary case. The covers may serve as an additional sealing means by partially blocking the contact surfaces.

Part of the contact surfaces of the main case and the auxiliary case may be blocked by the main cover. A flange may protrude from a side wall on an outer circumference of the main case. The main cover may be coupled to the flange, and disposed so that the end of the main cover can contact the surface of the auxiliary case. As the end of the main cover contacts the surface of the auxiliary case, an exposed area among the contact surfaces can be reduced. This can reduce dust or moisture from being introduced into the solar power inverter.

The present invention may have the following advantages.

Firstly, in a state where the gasket compressed by coupling bolts is disposed between contact surfaces between the main case and the auxiliary case, sealing may be performed as the two cases are coupled to each other. This can simplify the assembly operation, and can enhance a sealing performance.

Further, since part of the contact surfaces may be blocked by the main cover or the auxiliary cover, an exposed area among the contact surfaces can be minimized. This can reduce dust or moisture from being introduced into the solar power inverter.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, an embodiment of a solar power inverter according to the present invention will be explained in more detail with reference to the attached drawings.

Figure 1:
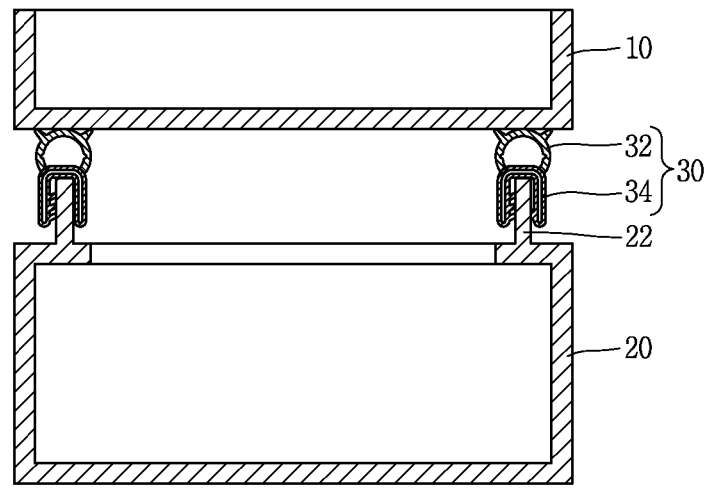
FIG. 1 is a sectional view schematically showing a sealing means for a solar power inverter in accordance with the conventional art.
Figure 2:
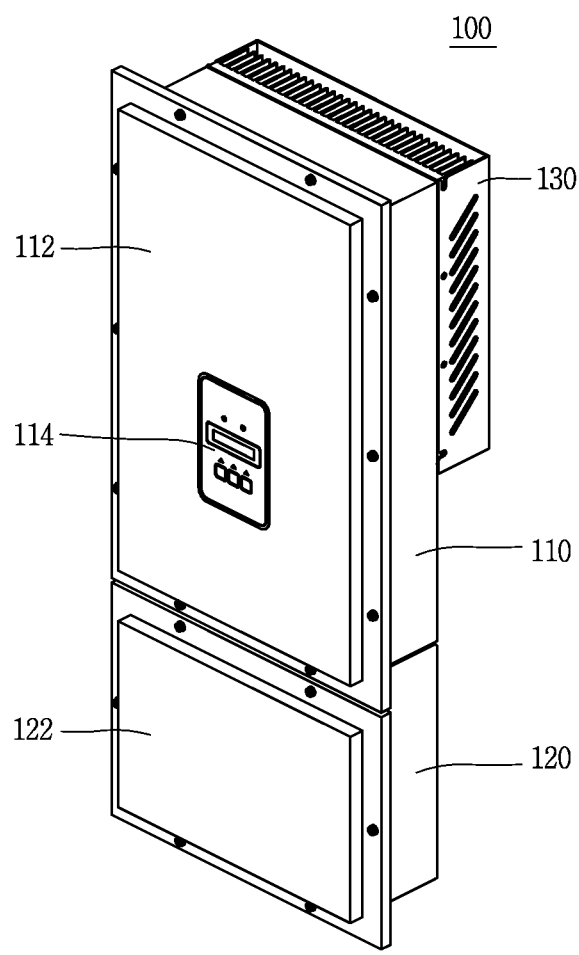
FIG. 2 is a perspective view of a solar power inverter according to an embodiment of the present invention.
Figure 3:
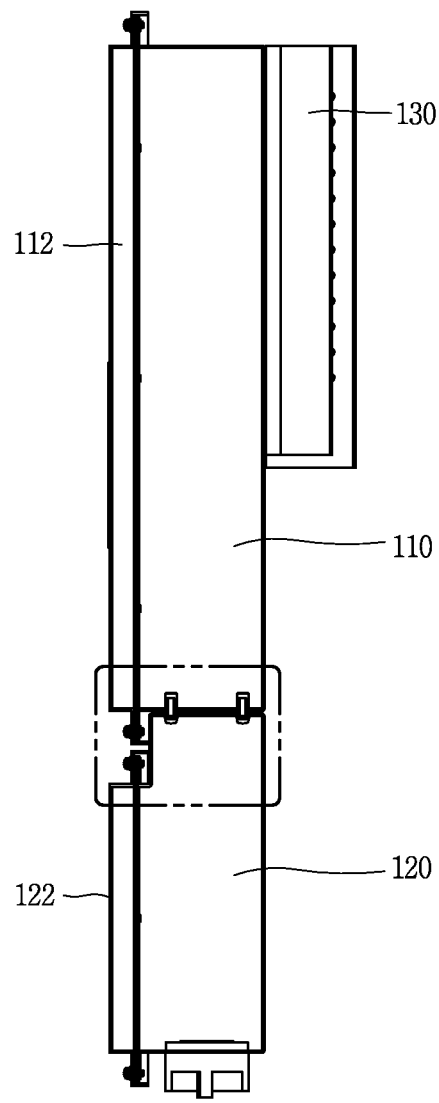
FIG. 3 is a side sectional view of the solar power inverter of FIG. 2.
Figure 4:
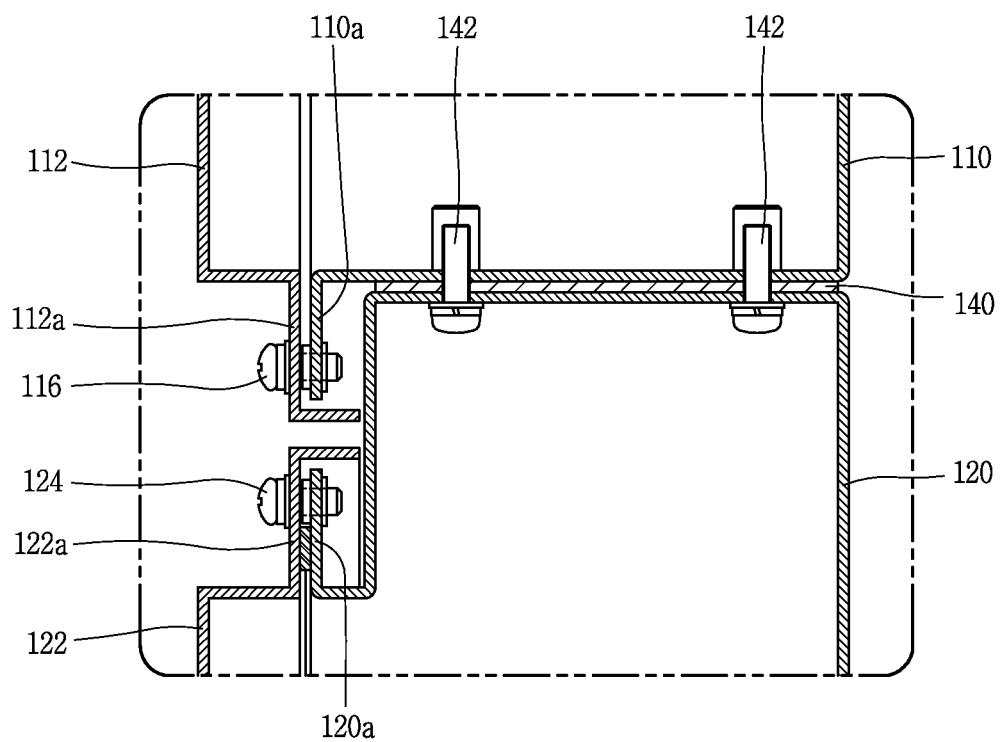
FIG. 4 is a side sectional view showing part of the solar power inverter of FIG. 3 in an enlarged manner.
Figure 5:
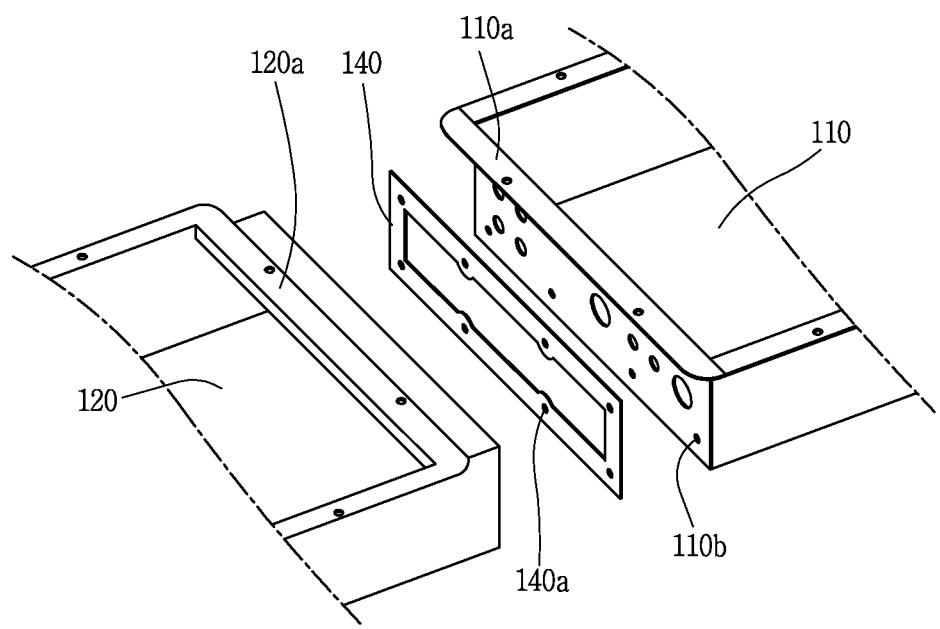
FIG. 5 is a disassembled perspective view of the solar power inverter of FIG. 2.

FIG. 2 is a perspective view of a solar power inverter according to an embodiment of the present invention, FIG. 3 is a side sectional view of the solar power inverter of FIG. 2, FIG. 4 is a side sectional view showing part of the solar power inverter of FIG. 3 in an enlarged manner, and FIG. 5 is a disassembled perspective view of the solar power inverter of FIG. 2.

Referring to FIGS. 2 to 5, the solar power inverter 100 includes a main case 110 and an auxiliary case 120 coupled to a lower end of the main case 110. Circuitry related to the solar power inverter is mounted in the main case 110, and various types of wires or pipes are accommodated in the auxiliary case 120.

As the inverter circuitry or wires accommodated in the main case 110 or the auxiliary case 120, may be used the existing circuitry or wires. Therefore, detailed explanations thereof will be omitted. A type of items to be accommodated in the main case 110 or the auxiliary case 120 can be arbitrarily determined by those skilled in the art. Accordingly, the scope of the present invention is not limited by a type of the items.

A heat sink 130 serving as a cooling means, is mounted to a rear surface of the main case 110. Generally, it is required that a solar power generating system should be installed at a place exposed to direct sunlight. It is also required that heat generated while the inverter circuitry operates should be properly cooled. The heat sink 130 serves to radiate, to the outside, heat generated from the inside of the main case 110. In some cases, may be used a cooling fan or a vapor compression type air conditioning system, rather than the heat sink.

Openings through which the items are introduced are formed on the front surfaces of the main case 110 and the auxiliary case 120. A main cover 112 and an auxiliary cover 122 for covering the openings are installed on the front surfaces of the main case 110 and the auxiliary case 120 respectively. On the front surface of the main cover 112, a manipulation panel 114 is installed to display an operation state of the solar power inverter, and to manipulate functions of the solar power inverter.

Referring to FIGS. 4 and 5, flanges 110a and 120a protrude from side walls on outer circumferences of the main case 110 and the auxiliary case 120. The flange 110a of the main case 110 protrudes from four surfaces of the main case 110, whereas the flange 120a of the auxiliary case 120 protrudes from three surfaces except for one surface facing the main case 110.

The flanges 110a and 120a provide positions for coupling the covers 112 and 122 to the main case 110 and the auxiliary case 120. More specifically, the covers 112 and 122 are provided with bending portions 112a and 122a on the outer circumferences thereof. As the bending portions 112a and 122a are coupled to the flanges 110a and 120a by bolts 116 and 124, the covers 112 and 122 are fixed to the main case 110 and the auxiliary case 120.

The flange 110a of the main case 110, and the bending portion 112a of the main cover 112 extend up to the front surface of the auxiliary case 120. Especially, the end of the bending portion 112a comes in contact with the front surface of the auxiliary case 120. As a result, part of the main cover 112 among contact surfaces of the main case 110 and the auxiliary case 120, is blocked by the main cover 112.

A gasket 140 is interposed between the contact surfaces of the main case 110 and the auxiliary case 120. As shown in FIG. 5, the gasket 140 has a hollow central portion so that only the edges of the contact surfaces can be covered. The gasket 140 is also provided with a plurality of through holes 140a for inserting coupling bolts 142 thereinto. More specifically, the coupling bolts 142 are inserted towards the main case 110 from the inside of the auxiliary case 120. For this, coupling holes 110b for coupling the coupling bolts 142 are formed at the main case 110. Further, coupling holes are formed at the auxiliary case 120 in correspondence to the coupling holes 110b.

The gasket 140 is formed of a flexible material such as silicon, and is disposed between the main case 110 and the auxiliary case 120 in a pressure-welded state by a coupling force of the coupling bolts 142. Accordingly, dust or moisture is effectively prevented from being introduced into the contact surfaces from the outside.

At least the front surface of the contact surfaces is blocked by the main cover 112. This can reduce an area where dust or moisture is introduced, and thus can enhance a sealing performance. Alternatively, the contact surfaces can be entirely blocked. However, in this case, the entire structure may become complicated, and the assembly operation may be difficult. Further, since the solar power inverter is generally mounted on the wall surface, the rear surface among the contact surfaces is blocked by the wall surface. Therefore, in the preferred embodiment, only the front surface of the contact surfaces is blocked for a simplified structure and an effective sealing performance.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A solar power inverter having a sealing means, comprising:
    a main case having an opening on a front surface thereof, the opening open and closed by a main cover;
    an auxiliary case coupled to one side surface of the main case, and having a second opening on a front surface thereof, the second opening open and closed by an auxiliary cover; and
    a gasket interposed between the main case and the auxiliary case,
    wherein the main case and the auxiliary case are coupled to each other by coupling bolts which pass through the main case, the gasket and the auxiliary case,
    wherein part of contact surfaces of the main case and the auxiliary case is blocked by the main cover,
    wherein a flange protrudes from a side wall on an outer circumference of the main case, and
    wherein the main cover is coupled to the flange, and disposed such that an end of the main cover contacts the front surface of the auxiliary case.

2. The solar power inverter having a sealing means of claim 1, wherein the gasket is formed of a silicon material.

3. The solar power inverter having a sealing means of claim 1, wherein one of the main cover and the auxiliary cover extends to the contact surfaces of the main case and the auxiliary case.

\* \* \* \* \*